(12) United States Patent
Lisec et al.

(10) Patent No.: US 11,137,364 B2
(45) Date of Patent: Oct. 5, 2021

(54) THERMALLY INSULATED MICROSYSTEM

(71) Applicant: FRAUNHOFER-GESELLSCHAFT ZUR FÖRDERUNG DER ANGEWANDTEN FORSCHUNG E.V., Munich (DE)

(72) Inventors: Thomas Lisec, Itzehoe (DE); Hans-Joachim Quenzer, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/334,941

(22) PCT Filed: Sep. 27, 2017

(86) PCT No.: PCT/EP2017/074467
§ 371 (c)(1),
(2) Date: Jul. 19, 2019

(87) PCT Pub. No.: WO2018/065272
PCT Pub. Date: Apr. 12, 2018

(65) Prior Publication Data
US 2019/0331626 A1    Oct. 31, 2019

(30) Foreign Application Priority Data
Oct. 7, 2016 (DE) .......................... 102016119031.4

(51) Int. Cl.
*G01N 27/12* (2006.01)
*G01N 27/16* (2006.01)
*G01F 1/684* (2006.01)

(52) U.S. Cl.
CPC .......... *G01N 27/16* (2013.01); *G01F 1/6845* (2013.01); *G01N 27/128* (2013.01); *H01L 2224/48091* (2013.01); *H01L 2224/8592* (2013.01)

(58) Field of Classification Search
CPC .... G01N 27/16; G01N 27/128; G01F 1/6845; H01L 2224/48091; H01L 2224/8592
See application file for complete search history.

(56) References Cited

U.S. PATENT DOCUMENTS 5,593,526 A   1/1997  Yokouchi et al.
5,801,092 A * 9/1998  Ayers ............... H01L 21/02282
                                                   438/623

(Continued)

FOREIGN PATENT DOCUMENTS

DE       10130379 A1    2/2003
DE    102009043413 B3    6/2011

(Continued)

OTHER PUBLICATIONS

Lucklum, et al., "High Temperature Micro-Hotplates on Porous Silicon Substrates", 2013 Transducers & Eurosensors XXVII: The 17th International Conference on Solid-State Sensors, Actuators and Microsystems, IEEE, Jun. 16, 2013, pp. 1907-1910.

(Continued)

*Primary Examiner* — Mohammad M Choudhry
(74) *Attorney, Agent, or Firm* — Duane Morris LLP

(57) ABSTRACT

This invention provides a microsystem comprising a porous thermal insulation body composed of particles of low thermal conductivity. The porous body isolates and stabilizes the microsystem.

14 Claims, 8 Drawing Sheets

(56) References Cited

U.S. PATENT DOCUMENTS

| | | |
|---|---|---|
| 6,261,469 B1 | 7/2001 | Zakhidov et al. |
| 2004/0016962 A1 | 1/2004 | Okumura et al. |
| 2004/0026365 A1 | 2/2004 | Fuertsch et al. |
| 2004/0147057 A1* | 7/2004 | Benzel ................ B81C 1/00047 438/54 |
| 2009/0158859 A1 | 6/2009 | Huang et al. |
| 2009/0184100 A1 | 7/2009 | Ohmi et al. |
| 2011/0279996 A1 | 11/2011 | Tomura et al. |
| 2012/0180839 A1 | 7/2012 | Hedler et al. |
| 2013/0075930 A1 | 3/2013 | Sekine et al. |
| 2014/0023849 A1 | 1/2014 | Lisec et al. |
| 2014/0069185 A1* | 3/2014 | Tu .......................... G01F 1/6845 73/204.26 |
| 2015/0151531 A1* | 6/2015 | Ohno ..................... H01L 51/524 156/755 |
| 2016/0054492 A1* | 2/2016 | Ihara ...................... C03C 17/42 359/359 |

FOREIGN PATENT DOCUMENTS

| | | | |
|---|---|---|---|
| DE | 102011010899 A1 | | 8/2012 |
| JP | WO 2016/104762 | * | 6/2016 |

OTHER PUBLICATIONS

Huang, et al., "Thermal Conductivity of Silica Nanoparticle Powder: Measurement and Theoretical Analysis", The European Physical Journal Plus, Springer Berlin Heidelberg, Dec. 4, 2015.

International Search Report issued in connection with International Patent Application No. PCT/EP2017/074467, dated Nov. 30, 2017, 4 pages.

International Preliminary Report on Patentability issued in connection with PCT/EP2017/074467, dated Apr. 11, 2019, 6 pages.

* cited by examiner

THERMALLY INSULATED MICROSYSTEM

REFERENCE TO RELATED APPLICATION

The present application is a National Stage Application, filed under 35 U.S.C. 371, of International Patent Application No. PCT/EP2017/074467, filed on Sep. 27, 2017, which claims for the priority of German Patent Application No. 10 2016 119 031.4, filed on Oct. 7, 2016, each of which is incorporated here by reference in entirety.

FIELD OF INVENTION

The present invention concerns a microsystem comprising a porous thermal insulation body composed of particles of low thermal conductivity.

STATE OF THE ART

Microelectromechanical sensors (MEMS sensors) based on thermal measurement principles, such as flow meters and gas sensors, are becoming increasingly important for a wide variety of applications. While flow meters have been used primarily for monitoring gaseous and liquid media in technical systems, gas sensors have been used to detect flammable or explosive gases. These include volatile organic compounds (heating gases, methane and ethanol), toxic gases (CO, $NO_x$, $H_2S$) or flue gases. However, there are now also many consumer applications, e.g. $CO_2$ monitoring in conference rooms, detection of odours such as cigarette smoke or kitchen fumes.

Calorimetric gas sensors and flow meters are based on so-called hotplates. In general, a hotplate consists of a thin-film heating element on a thermally insulated structure made of a material with the poorest possible thermal conductivity. In the following, the term "hotplate" is used synonymously for "heating element". Flow meters require temperatures up to 200° C. Often several heating elements or temperature sensors are arranged on the membrane. For gas sensors the operating temperature is 300-600° C. Depending on the functional principle, the hotplate can be provided with further coatings. The main problem of calorimetric components is the energy consumption to maintain the operating temperature. Especially for mobile applications a minimization of the power requirement is of great importance. Another problem is the fragility of the self-supporting MEMS structure that forms the hotplate. The hotplate can be located on a closed membrane of silicon oxide and silicon nitride. The latter is produced by etching the silicon from the back of the substrate. Alternatively, freestanding carrier structures can be used for the hotplate. Free-standing hotplate structures are obtained by etching out the silicon underneath from the front of the substrate. Both variants have advantages and disadvantages. With membrane-based hotplates, convection effects or pressure fluctuations in the volume below the membrane can falsify the measurement and pressure surges can destroy the structure. With free-standing hotplate structures, which span an open channel and are surrounded by the medium on both sides, the thermal insulation to the substrate is influenced by the medium. In contrast to diaphragm-based components, such flowmeters are therefore not suitable for liquids.

To permanently maintain a temperature of 400° C., conventional sensors require a power of about 15 mW to maintain the operating temperature. If the same sensors are only switched on for 2-3 seconds per minute, energy consumption is significantly reduced. However, this is still too high for certain applications.

The high power consumption results from the specifics of micromechanical structures. Since the area/cross section ratio of the heated area is very high, the heat losses, in contrast to macroscopic bodies, are not dominated by heat conduction in the volume, but by heat transfer to the ambient medium. The heat conduction through the membrane is responsible for only about 40% of the losses and also depends very little on the material used due to its very low thickness. The heat losses via the ambient air, on the other hand, amount to about 60%. A large part of this is lost via the cavity below the sensor. Consequently, a further reduction in heat loss can hardly be achieved by optimizing the design and material of a conventional sensor structure.

Problems to be Solved by the Invention

The state of the art does not offer a satisfactory solution to the main problem of calorimetric components. This main problem is the energy consumption to maintain the operating temperature. A further problem which is not satisfactorily solved in the state of the art is the fragility of self-supporting structures in microsystems.

Therefore, the goal of this invention is to provide a microsystem that solves the problem of thermal insulation and stabilization.

SUMMARY OF THE INVENTION

The present invention describes a novel possibility for the thermal isolation of microsystems, such as MEMS devices, which results in both a reduction of energy consumption and an increase in their mechanical stability.

The problem was solved by providing a microsystem with a porous thermal insulation body.

The subject-matter of the present invention is, in particular, the following:

[1] A microsystem comprising a porous thermal insulating body composed of particles having a thermal conductivity of less than 10 W/(m·K).

[2] The microsystem according to point [1], the particles having a thermal conductivity of less than 3 W/(m·K).

[3] The microsystem according to point [1] or [2], wherein at least a portion of the particles are bonded to one another by means of a coating.

[4] The microsystem according to point [3], where all particles are connected by a coating.

[5] The microsystem according to one of the above points, the thermal insulation body being subjected to negative pressure.

[6] The microsystem according to one of the above points, wherein the porous thermal insulation body is closed by an all-round wall so that uncoated particles are immovably enclosed.

[7] The microsystem according to point [6], wherein the all-round enclosure is obtainable by filling the particles through an opening in the recess of a substrate of the microsystem and then closing this opening by applying a sealing layer and/or by forming a solid coating by coating the particles at least at the opening.

[8] The microsystem according to any of the foregoing claims, wherein the thermal insulation body is arranged between at least two elements having different temperatures during operation of the microsystem and/or between at least one element heated during operation of the microsystem and the environment.

[9] The microsystem according to point [8], wherein the element heated during operation of the microsystem is a heating element.

[10] The microsystem according to one of the above points, wherein the microsystem is a flow sensor, gas sensor or radiation sensor.

Other preferred embodiments are:

The microsystem according to one of the above points, wherein all particles are bonded together by means of coating and there is a vacuum in the thermal insulation body.

The microsystem according to one of the above points, wherein all particles are bonded together by coating and the thermal conductivity of the particles is less than 3 W/(m·K).

The microsystem according to one of the above points, wherein the thermal conductivity of the particles is less than W/(m·K) and there is a vacuum in the thermal insulation body.

The microsystem according to one of the above points, wherein the thermal insulation body has a porosity of at least 20% and preferably 30-80% and more preferably 40-70%.

The microsystem according to one of the above points having dimensions of 10 to 3000 μm.

Particularly preferred is a microsystem according to one of the above points, wherein all particles are connected to each other by means of coating, the thermal conductivity of the particles is less than 3 W/(m·K) and there is a vacuum in the thermal insulation body.

Even more preferred is a microsystem according to one of the above points with dimensions of 10 to 3000 μm, wherein the thermal insulation body has a porosity of at least 20%, all particles are bonded together by means of coating, the thermal conductivity of the particles is less than 3 W/(m·K) and there is a vacuum in the thermal insulation body.

Advantages and Application of the Invention

The inventive microsystems combine the possibilities of conventional super-insulations with microtechnical manufacturing processes.

For example, the thermal insulation of a hotplate by means of a porous body offers decisive advantages over conventional MEMS components.

A first advantage is the mechanical stiffening of the hotplate. The application possibilities of conventional membrane-based components are considerably limited by the fragility of the thin membrane, which can easily be damaged by e.g. pressure surges, particle bombardment or thermally induced stress at operating temperature.

A second advantage over state of the art flow sensors is that the porous structure suppresses convection effects and pressure fluctuations in the cavity below the sensor membrane, which can lead to a falsification of the measurement.

A third advantage is that a silicon substrate with embedded porous structures can be processed like a normal wafer. Using established semiconductor technology techniques, vertical electrical feedthroughs (Through Silicon Vias, TSV) can easily be integrated to spatially separate the electrical connections from the sensor area. By using such feedthroughs, the flow of the medium over the sensor surface is almost not falsified.

The reduced heat output thanks to improved thermal insulation in combination with mechanical stabilization of the sensor structure and spatial separation of the electrical connections opens up new areas of application.

If the invented microsystems are gas sensors, they can be used much more easily in arrays for electronic noses or in so-called "sensor skins". The latter in particular require a flat design and the possibility of flush mounting.

Flow sensors could be used for wireless sensor nodes to monitor drinking water pipelines in utility networks for real-time detection of leaks, consumption or unauthorized use. Flow measurements on the outer skin of vehicles and aircraft or in turbines are also possible. The possibility of a simple, conclusive integration into the walls of pipes or lines of any shape would also allow mass use in household appliances for flow measurement (coffee machines, air conditioners, showers, toilet flushes, etc.).

At a certain size of the particles contained in the thermal insulation body (2 μm-20 μm), the IR light emitted by the heated surfaces also scatters, so that losses due to radiation transports are minimized.

The technology described here is not limited to the manufacture of hotplates for chemosensors or thermal flow sensors, but is always advantageous when the best possible thermal insulation is required in a very confined space.

The construction of miniaturized thermal IR sources which have to be operated at temperatures of some 100° C. is obvious.

But this technique is also suitable for the construction of miniaturized atomic clocks, gyroscopes or magnetometers, because the smallest gas cells have to be kept at a temperature of over 100° C. in order to keep the alkali metal (usually rubidium) contained in them in a gaseous state.

Last but not least, the best possible thermal insulation plays a key role in miniaturised thermal engines in order to reduce losses due to heat conduction and increase overall efficiency. An example is the construction of pyroelectric harvesters.

DESCRIPTION OF THE FIGURES

In FIG. 1a all particles are coated, in FIG. 1b only a part of the particles is coated.

EMBODIMENTS OF THE INVENTION

Microsystem

Figure 1A:
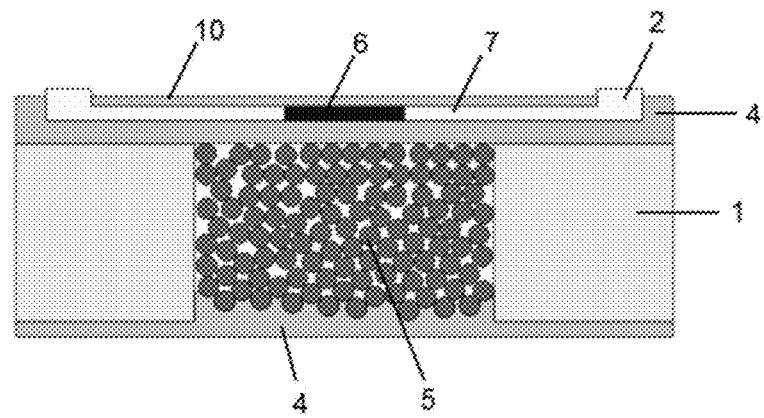
FIGS. 1a and 1b show the schematic cross-section through a microsystem according to the invention. It is a hotplate assembly in which the rear cavity was filled with a porous body after completion of the MEMS device.

The microsystem according to the invention has dimensions in the range from micrometers to millimeters. Preferably the dimensions are in the range from 1 µm to 10 mm, more preferably in the range from 10 µm to 5 mm, even more preferably in the range from 50 µm to 2 mm.

The microsystem can be a MEMS structure.

In particular, the MEMS structure can be a calorimetric MEMS device based on a hotplate, e.g. a flow meter, a catalytic gas sensor, a MOS gas sensor (MOS means semiconducting metal oxide) or a radiation sensor (bolometer).

Thermal Insulation Body

The thermal insulation body, which is sometimes referred to simply as "porous structure" or "porous body" in the following, is arranged in the microsystem in such a way that it serves as thermal insulation. For this purpose, the thermal insulation body is located between two elements which have a temperature difference, for example between two elements of the microsystem according to the invention. Alternatively or additionally, the thermal insulation body is arranged between an element of the microsystem and the environment. The environment can be an element of another structure or the surrounding fluid, i.e. a liquid or a gas.

Furthermore, the thermal insulation body may be located in the space between at least two elements of the microsystem or in a recess or cavity of a single element of the microsystem.

The thermal insulation body is enclosed on all sides by other structures in one embodiment, whereby these structures are preferably elements of the microsystem according to the invention. This inclusion of the thermal insulation body on all sides makes it possible for a portion of the particles to be present unsolidified, i.e. loose. The thermal insulation body is preferably sealed using a sealing layer (9).

In another embodiment, the thermal insulation body is not enclosed on all sides by other structures. In this case, at least on the side which is not enclosed by another structure, the thermal insulation body shall have an area of solidified particles such that it forms a closure which is coherently connected to the other structures.

In any case, the structures are designed and interconnected in such a way that a closed space is created from which no loose particles can exit and thus be lost to the thermal insulation body.

Particles

The particles have an average size in the range from nanometers to micrometers, preferably from 10 nm to 100 µm, stronger preferred from 100 nm to 30 µm, even stronger preferred from 1 µm to 20 µm.

The material forming the particles prefers a low thermal conductivity. However, it is also possible to use a mixture of particles from different materials, whereby one material has a relatively high thermal conductivity of e.g. 40 W/(m·K). The other material has a relatively high thermal conductivity of e.g. 40 W/(m·K). Since the particles only touch each other selectively, the effective thermal conductivity of a corresponding porous body is lower.

The particles can consist of silicon oxide, for example, which has a thermal conductivity of about 1.2 to 1.4 W/(m·K). Other metal oxides with low thermal conductivity are e.g. yttrium oxide ($Y_2O_3$) or zirconium oxide (zirconia, $ZrO_2$).

Under standard conditions, aluminium oxide has a thermal conductivity of 35.6-39 W/(m·K) (monocrystalline corundum: 40 W/(m·K), dense ceramic with 96% $Al_2O_3$ approx. 25 W/(m·K)), which rises sharply with decreasing temperature and drops to about 5 W/(m·K) with increasing temperature at 1000° C. The thermal conductivity of aluminium oxide is also very low.

Glass has different thermal conductivity depending on its composition, for example Zerodur 1.46 W/(m·K) and soda-lime glass 0.80 W/(m·K).

Example metals have the following thermal conductivities: Tungsten 167 W/(m·K), Ni 85 W/(m·K), Iron 80 W/(m·K), Tin 67 W/(m·K), Tantalum 54 W/(m·K), Titanium 22 W/(m·K), Bismuth 8.4 W/(m·K).

Typical thermal insulation materials such as kaolin, chalk and talc have a thermal conductivity of less than 2 W/(m·K).

Of course, organic polymers can also be used, for example: Polyurethane compact (PUR) 0.245 W/(m·K); Polytetrafluoroethylene (PTFE) 0.25 W/(m·K); Polyvinyl chloride (PVC) 0.17; Polypropylene (PP) 0.23 W/(m·K); Polycarbonate 0.20 W/(m·K); epoxy resin (EP) 0.20 W/(m·K); polymethyl methacrylate (PMMA, plexiglass) 0.19 W/(m·K); polysiloxanes (silicone) 0.2 . . . 0.3 W/(m·K).

The particles preferably have a relatively small diameter of less than 20 µm, preferably less than 10 µm and especially preferably less than 5 µm.

In order to avoid damage to the support element and/or particles during coating, it is advantageous if the particles and substrate are heat resistant up to a temperature of at least 60° C., preferably 150° C. or 300° C. The higher the heat resistance, the fewer restrictions there are with regard to the coating processes that can be used. At the same time, the high heat resistance allows the process to be carried out more quickly without the risk of damaging the particles and/or the carrier element through overheating.

In order to avoid loss or reduction of porous properties, the particles are preferably not irreversibly deformed when they are joined.

A particle mixture with particles of at least two different materials is introduced in a particularly preferred embodiment. The materials preferably differ in at least one physical or chemical property. For example, a hardness, an electrical conductivity, a thermal conductivity, a coefficient of thermal expansion and/or the electrochemical parameters of the particles can be selected differently. By using different materials with different mixing ratios and different chemical and physical properties, the properties of the three-dimensional structure can be precisely and reliably adapted and adjusted to the desired specifications.

For example, a coefficient of thermal expansion of the particles or the particle mixture can be adapted to the coefficient of thermal expansion of the carrier element. The coefficient of thermal expansion of the particles or the particle mixture can also be adapted to a component in which the connected particles are to be arranged.

The particles can also be a mixture of different materials in particle form. For example, particles can be used to adjust the effective coefficient of thermal expansion.

It may also be advantageous to add short fibres to the particles in order to increase the mechanical stability of the entire microstructure.

Depending on the intended application, it can therefore be advantageous to adapt the particle size to the expected working temperature of the sensor element.

Thermal Conductivity

The thermal conductivity of the particles is less than 10 W/(m·K), preferably less than 5 W/(m·K), more preferably less than 3 W/(m·K) and even more preferably less than 1 W/(m·K). The indication of the thermal conductivity refers to the measurement at 20° C., 1013 hPa and 50% relative humidity.

The thermal conductivity value of the particles may also refer to a mixture of particles of different materials with a total conductivity of less than 10 W/(m·K) or a total conductivity within the preferred ranges mentioned.

Coating

In a preferred embodiment, at least a portion of the particles is bonded together by means of a coating.

Preferably this portion is at least 5%, at least 10%, at least 20%, at least 50% or at least 90%.

In a more preferred embodiment, at least 95%, more preferred at least 98% and even more preferred all particles are bonded together by means of a coating.

In one embodiment, the thermal insulation body is surrounded by a wall on all sides. This wall can surround a space which is initially provided with an opening for the filling of the particles. The opening can then be closed by coating the particles to form a solid coating at least at the opening. This coating then accounts for 3 to 50%, preferably 5 to 30% and more preferably 10 to 20% of the total amount of particles.

Thermal Insulation

The term thermal insulation used here means the reduction of heat transfer by heat conduction, preferably the reduction of heat transfer by heat conduction and at least one type of heat transfer selected from thermal radiation and convection.

The reduction of heat conduction is achieved by using a material with low heat conductivity.

The reduction of convection is achieved by using a material with associated particles. This material contains or consists of the thermal insulation body contained in the microsystem.

Negative Pressure

The thermal insulation body is preferably subjected to negative pressure. This means that the pressure inside is lower than the pressure outside the body. It is preferable to reduce the pressure in at least part of the heat-insulating body in which pores are located.

The term "negative pressure" also includes vacuum.

The negative pressure is less than 1013 hPa, preferably less than 1000 hPa, more preferably less than 700 hPa, even more preferably less than 500 hPa.

A negative pressure in the range from 10-3 to 300 hPa is most preferred, or especially in the range from 1 to 100 hPa.

The term 'vacuum' used here means that the pressure is less than 300 hPa, preferably less than 100 hPa, more preferably less than 10 hPa and even more preferably less than 1 hPa.

The negative pressure has the advantage that the thermal conductivity of the thermal insulation body is additionally reduced.

Porosity

The thermal insulation body contained in the microsystem according to the invention is porous, i.e. it has a large number of pores between the particles.

The pores are filled with gas or empty in vacuum.

The porosity indicates the ratio of the cavity volume to the total volume of the thermal insulation body. The porosity of the thermal insulation body is high for weight reasons. In particular, if a negative pressure or vacuum is present in the thermal insulation body, a high porosity leads to a low weight with simultaneous good thermal insulation.

Examples of porosity ranges are 1 to 70%, 5 to 40% or 10 to 50%. Other examples are porosities of more than 1%, more than 5%, more than 10%, more than 20%, more than 30%, and more than 50%; and each of these values optionally associated with an upper limit of 80%, or each of these values optionally associated with an upper limit of 70%.

The porosity can be controlled. A reduction of the porosity is possible by additional coating. Higher porosities can be achieved if the particles themselves are already porous or, for example, have a branched form.

Sealing Layer

Depending on the embodiment, a sealing layer (9), also known as a cover layer, can be applied at least partially to the arrangement of particles and carrier element, which essentially completely closes off cavities close to the surface and/or forms a closed layer on an uppermost layer of the particles. The surface layer is preferably planarised subsequently, for example by grinding or polishing. This allows a particularly smooth layer to be created.

In one embodiment, the thermal insulation body is surrounded by a wall on all sides. This wall can surround a space which is initially provided with an opening for the filling of the particles. The opening can then be closed by applying a sealing layer (9).

The sealing layer is applied after optional bonding of a portion or all of the particles by coating.

First Preferred Process for Producing the Porous Structure

In the present invention, the thermal insulation body (porous structure) is preferably produced by placing a large number of particles in a recess to form a porous structure.

A general process for the production of porous structures is described in DE 10 2011 010 899 A1.

Particles are firstly applied to or introduced into a carrier element. Between the particles, a multitude of at least partially interconnected cavities is formed. The cavities are also called pores. The particles come into contact with each other at points of contact. The application can be done for example by squeegees. The particles can be of any shape and size.

After the introduction or application of the particles, they are preferably joined together. This connection takes place at the points of contact. For this purpose the particles are coated, whereby the cavities are at least partially penetrated by the layer produced during coating.

Depending on the embodiment, the cavities can remain open during coating, i.e. the coating creates a bond between the particles, but the majority of the cavities between the particles remain bonded. Alternatively, at least part of the voids may be closed by the layer so that the voids form closed pores.

It is also possible that only a part of the particles is bonded during coating, i.e. both partial and complete penetration of the cavities with the layer produced during coating is possible.

If essentially all particles are connected to each other and thus essentially all cavities are penetrated, a layer is also formed on the area of the carrier element in which the particles are deposited or introduced.

Depending on the application, electrically conductive or non-conductive particles can be used. Electrically conductive or non-conductive materials can also be used for the coating.

A relatively uncomplicated and uniform application of the coating is possible by means of a CVD process (chemical vapor deposition) and in particular by atomic layer deposition. In atomic layer deposition, two different components are alternately introduced in the gaseous state, whereby these are each deposited on the surface of the particles or carrier element. During each deposition process, an essentially continuous one atom thick layer is formed. This creates a particularly even layer. The thickness of a layer is mainly determined by how often a change is made between the introduction of a first component and the introduction of a second component.

A thickness of the applied layer can preferably be between one atomic layer and 5 µm, between 5 nm and 1 µm or between 50 nm and 300 nm. Small layer thicknesses have the advantage that they can be produced within a short period of time, whereas layer thicknesses in the upper range of the specified spans make a particularly strong and reliable connection possible.

The coating preferably occupies a negligibly small proportion of the volume of the cavities formed during the introduction or application of the particles. A volume of the layer can preferably be less than 1% of a volume of the cavities.

Depending on the embodiment, either only a part of the particles or essentially all of the particles applied are bonded together. The joining of essentially all particles is particularly advantageous if a structure of the carrier element is to be moulded.

The particles can be arranged in loose contact with each other before coating. This means that no additional process steps are required to create a bond between the particles before the coating is applied.

Substrates made of silicon, glass or ceramics have proven to be particularly suitable substrates. The substrate can be designed as a wafer or plate, for example. Silicon wafers are particularly suitable for microelectronic applications.

FIG. 2a and FIGS. 6a to 6e illustrate a form of the procedure.

In a first process step, a substrate 1 is provided for this purpose, into which a recess 20 is made. Particles are filled into the recess 20, e.g. by trickling the particles and/or using a squeegee. The arrangement and alignment of the particles to each other is arbitrary.

In a subsequent process step, a coating with a thickness of 10 nm to 300 nm is applied by a CVD (chemical vapor deposition) process, more precisely by atomic layer deposition. The coating material not only forms a layer at the bottom of the well or next to it, but also deposits on the particles. Since the particles are in contact with each other at points of contact after being filled into the recess 20, the coating material attaches the particles to each other so that they form a coherent body of solidified particles. During the coating process, the particles and the substrate element are heated to between 60° C. and 300° C. The coating is then applied to the substrate. The material is designed to be temperature-resistant for particles and substrate elements.

Figure 2A:
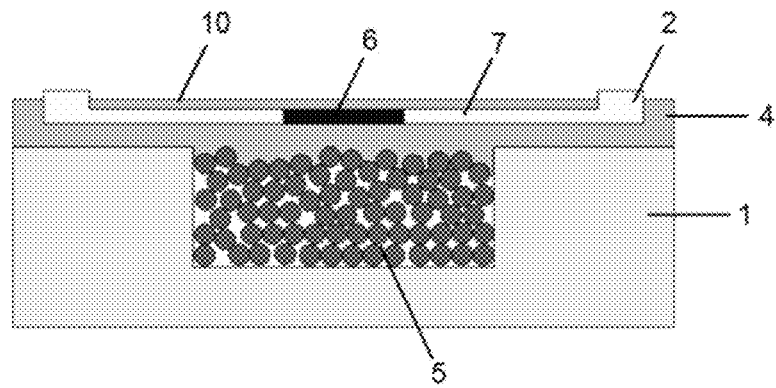
FIGS. 2a to 2c show the schematic cross-section through a microsystem according to the invention with a hotplate arrangement, which is realized only after generation and planarization of the thermally insulating porous areas in the substrate.
Figure 2B:
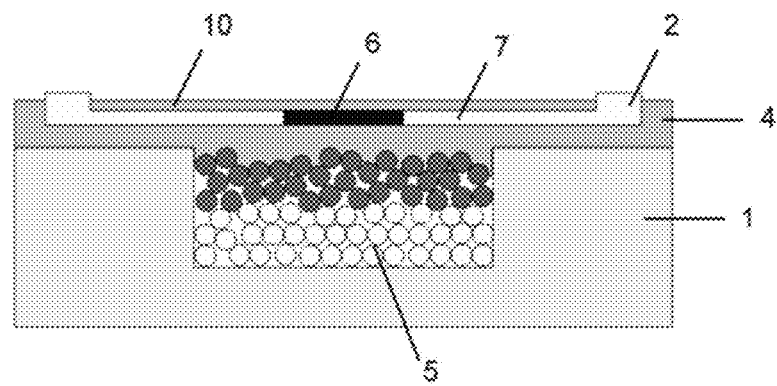

FIG. 2b shows another variant in which the particles are not solidified to the bottom of the well. The matching process is shown in FIGS. 7a to 7e.

Figure 2C:
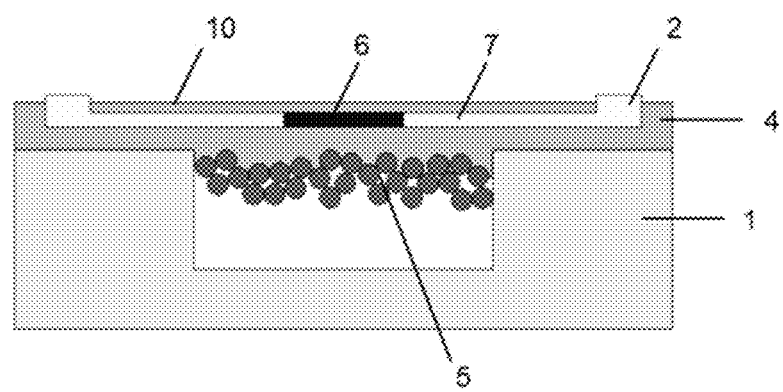

FIG. 2c shows a third variant in which the particles left loose according to FIG. 2a are selectively etched out before sealing. This can be done using a suitable etching gas through the pores between the solidified particles 17. If the unsolidified particles 18 consist e.g. of silicon dioxide, they can be removed in the $XeF_2$ gas phase. The process is shown in FIGS. 8a to 8f.

Figure 9A:
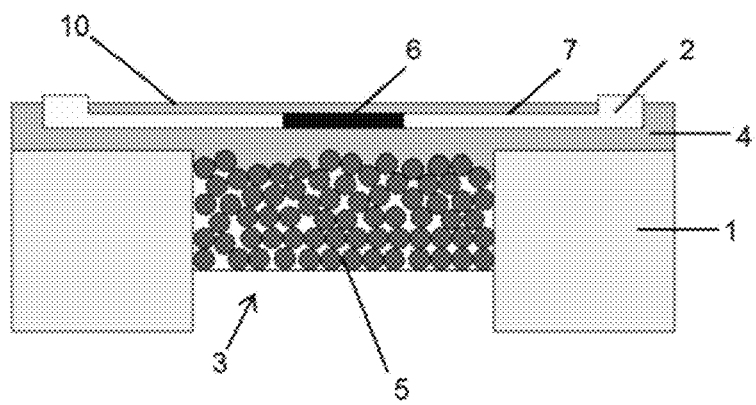
FIGS. 9a and 9b show the schematic cross-section through a microsystem according to the invention.
Figure 9B:
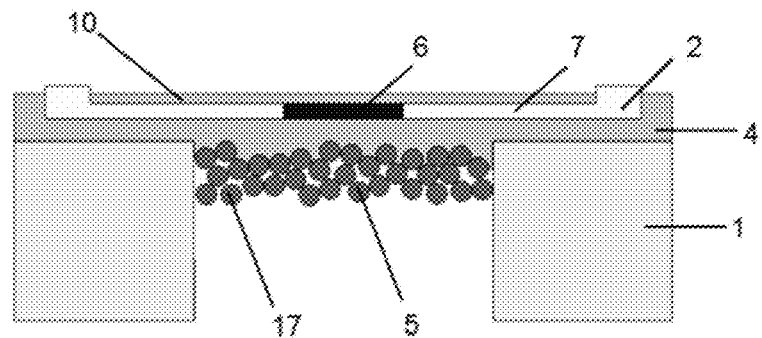

A further example of the procedure according to the invention is explained below (FIGS. 9a and 9b). With this design, a substrate with a filled recess 20, as described in conjunction with FIG. 2a or 2b, is first produced. In this example, however, the process parameters of the ALD process can also be selected in such a way that the ALD layer does not completely penetrate the cavities, i.e. not all particles necessarily have to be bonded together. Subsequently, substrate 1 is partially removed so that the compacted particles are only attached to the edge of the substrate, while they form a self-supporting membrane in a central area. If some particles are not connected, they are also removed in this process step. The thickness of the self-supporting membrane, which can be about 40 µm, for example, is then determined by the penetration depth of the ALD layer into the recess 20 filled with particles. This may, in particular when substantially all particles have been bonded and the coating material has penetrated the cavities to the bottom of recess 20, still be covered on its reverse side with the substantially closed ALD layer formed on the surface of substrate 1 during application of the coating.

This ALD layer, if present, is removed in the subsequent process step. The removal can be done for example by ion beam etching.

Alternatively, the ALD envelope (3) is retained and covered from below with a sealing layer. Thus the porous body is under vacuum according to FIG. 9a (in contrast to FIG. 9b).

In the following, preferred embodiments of the procedure are indicated:

[1] A method for creating a three-dimensional structure with the steps:
  applying or introducing particles onto or into a substrate (1), wherein a plurality of at least partially interconnected cavities are formed between the particles and wherein the particles come into contact with one another at contact points,
  connecting the particles at the points of contact by coating the particles, the cavities being at least partially penetrated by the layer produced during coating.

[2] The method according to point [1], characterised in that the coating is carried out by means of a CVD process and in particular an atomic layer deposition.

[3] The method according to one of the preceding points, characterized in that the layer is formed with a thickness between one atomic layer and 5 µm, preferably between 5 nm and 1 µm and particularly preferably with a thickness between 50 nm and 300 nm.

[4] The method according to one of the preceding points, characterized in that the particles and/or the substrate (1) are heat resistant up to a temperature of at least 60° C., preferably 150° C. or 300° C.

[5] The method according to one of the preceding points, characterized in that the particles do not deform substantially irreversibly when they are joined.

[6] The method according to one of the preceding points, characterized in that a particle mixture with particles of at least two different materials is introduced.

[7] The process according to one of the preceding points, characterized in that substantially all the particles applied or introduced are bonded together by the coating.

[8] The process according to one of the preceding points, characterized in that the particles are arranged in loose contact with each other before coating.

[9] The method according to one of the preceding points, characterized in that a substrate is used which is made of silicon, glass or ceramic.

[10] The method according to one of the preceding points, characterized in that elements having at least ten times an average volume of a particle are embedded with and bonded to the particles and the substrate (1) during coating.

[11] The method according to one of the preceding points, characterized in that, after coating the particles, a covering layer (sealing layer 9) is applied at least partially, which preferably completely closes off cavities close to the surface and which is particularly preferably subsequently planarized.

[12] The process according to one of the preceding points, characterized in that, after coating and bonding of the particles, the substrate (1) and optionally the uncoated particles are at least partially removed, the removal preferably being carried out by etching.

Second Preferred Process for Producing Porous Structure

In this process, the thermal insulation body is preferably produced by arranging a large number of particles in a recess so that a porous structure is formed.

Connecting a part of the particles prevents the remaining particles from escaping, so that the operation of the reactor is reproducible and permanent.

According to a embodiment example, a device comprises a substrate having a recess and a plurality of particles disposed in the recess.

The term "device" used below may be, be contained in or form part of the microsystem according to the invention.

The term 'porous structure' used below may be, be contained in or contain as a constituent of the thermal insulating body contained in the microsystem in respect of which the invention was made.

In a preferred embodiment, a first portion of the particles is bonded by a coating to a porous structure and a second portion of the particles is not bonded by the coating.

The first fraction of particles is located closer to an opening in the recess than the second fraction of particles, so that escape of the second fraction of particles from the recess through the opening is prevented. This allows properties of the uncoated portion of particles to be little or not affected by the coating. At the same time a high surface area and therefore a high porosity can be obtained by means of the arrangement of particles.

The particles are bonded together to form a composite structure. In one embodiment, the entire particles are integrated into the composite structure. The manufacture of the composite structure is described below.

According to another example, the first portion of particles comprises a plurality of cavities arranged between the particles of the first portion, which are at least partially interconnected, the porous structure being immovably connected to the substrate. One of the advantages of this embodiment example is the stabilization of the substrate.

According to another example, the opening of the recess is adjacent to a cavity of the device or to the environment. The advantage of this is that the second fraction of particles can be held in place by the first fraction of particles. Relative to the cavity of the device, for example an internal volume, this prevents the second fraction of particles from falling out or trickling.

In another example, a method of manufacturing a device includes providing a substrate that has a recess, inserting a plurality of particles into the recess. The process further comprises coating a portion of the plurality of particles so that the first portion is bonded to form a porous structure.

The coating is carried out by a coating process that has a penetration depth from an opening in the recess into the recess. The penetration depth is set so that a second portion of the particles is not bonded by the coating, the first portion of particles is located between the second portion of particles and an environment of the recess, and movement of the second portion of particles towards the environment of the recess is substantially prevented. This means that the first fraction of particles can be arranged facing the opening of the recess.

FIG. 2b shows a schematic side cut view of a device comprising a substrate 1. Substrate 1 includes a recess 20, such as a blind hole, trench or recess. A large number of particles are arranged in recess 20. A first part 17 of the particles is connected by a coating to a porous structure 5. A second part 18 of the particles is not bonded by the coating.

The first part 17 of the particles is located closer to an opening 19 of the recess 20 than the second part 18 of the particles. A leakage of the second part 18 of particles from the recess through the opening 19 of the same is prevented by the porous structure 5, i.e. the first part 16 of the particles. The porous structure 5 can be firmly bonded to the substrate 1, for example by the first part 17 and the substrate 1 having the same coating and the coating bonding both the particles of the first part 16 to each other and the porous structure 5 to the substrate 1. Alternatively, it is also conceivable that the porous structure 5 is bonded to substrate 1 in a different way, for example by a printing, pressing or adhesive process.

The porous structure 5 is formed so as to have a plurality of cavities at least partially joined together. The cavities can be preserved by the fact that particles brought into contact with each other have cavities arranged between them, which remain at least partially unclosed by the coating.

A coating of the first fraction 16 may be carried out by any suitable process (coating process), such as Atomic Layer Deposition (ALD), Physical Vapor Deposition (PVD) or Chemical Vapor Deposition (CVD).

For example, in the course of a manufacturing process, a large number of particles can be arranged in the recess 20, whereby the particles can be different, but also similar. Subsequently, the first portion 16 may be coated by selecting the coating parameters or by terminating or discontinuing the coating when a sufficient number of particles are coated so that the first portion 17 can form the porous structure 5. The coating process may have a penetration depth of 21 which describes an effectiveness (coating of particles) of the coating process from opening 19 along a depth direction of 22 into recess 20. In simplified terms, particles of the first portion 16 are disposed substantially at a distance from the opening 19 which is less than or equal to the penetration depth 21 of the coating process.

The particles of the second part 18 may be located at a distance from the opening 19 greater than the penetration depth 21 of the coating process. Setting the penetration depth 21 can include setting a parameter of the coating process, such as pressure, time, temperature, etc. The penetration depth 21 can also be set to a value of the coating process. For example, the penetration depth 21 can be set in such a way that, for an atomic layer deposition (coating process), a residence time of a first or second reactant is set in such a way that it penetrates the particles from the opening 19 or a cover surface (filling level) of the particles only up to the penetration depth 21. A coating takes place, for example, when both reactants (sequentially one after the other) come into contact with the particle and are deposited, for example, on the particle. For example, a reactant can be introduced and parts not arranged on particles can be removed (sucked off) before another reactant is introduced. If both reactants come into contact with each other at the particles, a coating can be formed there. If the residence time is set so that at least one of the reactants does not exceed penetration depth 21, a coating of particles which are at a greater distance from the opening 19 than penetration depth 21 can be reduced or avoided. Alternatively, a coating duration of a CVD deposition, for example, can be set in such a way that a coating of particles with a greater distance to the opening 19 than the penetration depth 21 is essentially or completely prevented. For example, if $Al_2O_3$ is used, a "penetration depth" within which the particles are coated can be set within wide limits. Aspect ratios over 1000 can be achieved.

This means that a chemical or physical property of the second part of the multiplicity of particles may remain substantially unchanged during a manufacturing process.

Coating can be carried out from one side of the recess 20 environment in one direction of a recess volume. This allows particles (the first portion 17) located adjacent the opening 19 of the recess to be coated while particles spaced from the opening 19 remain uncoated.

The ratio of the number of particles of the second fraction to the number of particles of the first fraction may be 0.01, 0.1, 0.2, 0.5, 1, 2, 10 or greater. This means that there can be more uncoated particles than coated particles, or vice versa. In one embodiment all particles are coated.

Substrate 1, for example, can be a discharge material. The semiconductor material can be, for example, a silicon material or a gallium arsenide material. Alternatively or additionally, substrate 1 may comprise a glass material, a ceramic material, a glass ceramic material and/or a plastic material. Substrate 1 may have a doping. For example, the semiconductor material can be doped, for example with a boron material. For example, substrate 1 is a MEMS wafer. The substrate 1 can have a planar or non-planar shape (e.g. curved).

If the coating process (in particular the residence time of the reactants) is modified, it can be achieved that the introduced particles are only coated to a certain depth.

A fall out of the uncoated, i.e. loose particles, can be prevented by bonding the porous structure to the substrate 22 or by preventing the porous structure 5 from coming loose from the substrate. This allows materials in powder form, i.e. the second part of the particles, to be enclosed in a miniaturised container, i.e. the recess.

In one version, the introduced particles are only coated on the surface in the corresponding steps. In order to avoid interaction of the reactive particles with the environment, ALD processes can be used that are highly effective even at low temperatures, as is the case with $Al_2O_3$, for example.

The examples described above are independent of the size (e.g. diameter or lateral dimension) of the particles.

Although the above described examples have been described in such a way that the porous structure has cavities which are at least partially connected to each other, so that the porous structure 5 forms a porous membrane, the coating can also achieve, especially with a particle size of <2 μm, that the porous structure 5 is sealed, i.e. the cavities between the particles are closed. Thus a recess can also be closed by means of the coating.

In the following, the preferred embodiments of the device (microsystem) and the process for its manufacture are described.

[1] A device with:
a substrate having a recess; and
a large number of particles arranged in the recess;
wherein a first portion of the particles is bonded by a coating to form a porous structure and a second portion of the particles is not bonded by the coating; and
the first portion of particles being located closer than the second portion of particles to an opening of the recess such that escape of the second portion of particles from the recess through the opening is prevented.

[2] The device according to point [1], wherein the first portion of the particles comprises a plurality of cavities disposed between the particles of the first portion of the particles, the cavities being at least partially connected to each other and the porous structure being immovably connected to the substrate.

[3] The device according to one of the preceding points, wherein a substrate comprises a material selected from a discharge material, a glass material, a ceramic material, a glass-ceramic material and a plastic material.

[4] A method of manufacturing a device comprising the steps of:
providing a substrate having a recess;
introducing a large number of particles into the recess;
coating a first portion of said plurality of particles so that said first portion is bonded to a porous structure using a coating process having a penetration depth from an opening of said recess along a depth direction into said recess; and
wherein the penetration depth of the coating process into the recess is adjusted such that a second portion of the particles is not bonded by the coating, and that the first portion of particles is disposed between the second portion of particles and an environment of the recess and movement of the second portion of particles towards the environment of the recess is substantially prevented.

[5] The method according to point [4] in which coating is carried out from one side of the vicinity of the recess towards a volume of the recess so that particles of the first portion located adjacent the opening are reached and coated by the coating process based on the penetration depth of the coating process and particles of the second portion spaced from the opening are not coated.

[6] The method according to point [4] or [5] in which the coating step is performed by chemical vapor deposition, atomic layer deposition or atomic vapor deposition.

[7] The method according to any one of points [4] to [6] in which a chemical or physical property of the second portion of the plurality of particles remains unchanged during the method.

EXAMPLES

Using the process described in DE 10 2011 010 899 A1, a membrane based hotplate is provided with a porous vacuum sealed support. Since the particles of such a porous body only touch each other selectively and an ambient medium is missing, the hotplate is much better insulated at the bottom than conventional components without a porous structure (heat insulation bodies).

A first embodiment is shown in FIG. 1. The cavities are filled below the membrane at substrate level from the back with particles of a thermally poorly conducting material (e.g. SiO$_2$) and these are solidified with an Al$_2$O$_3$-ALD layer. The porous bodies are then sealed under vacuum by applying a sealing layer to the back of the substrate, e.g. using PECVD. It is not absolutely necessary to remove part of the particles or the substrate.

Figure 1B:
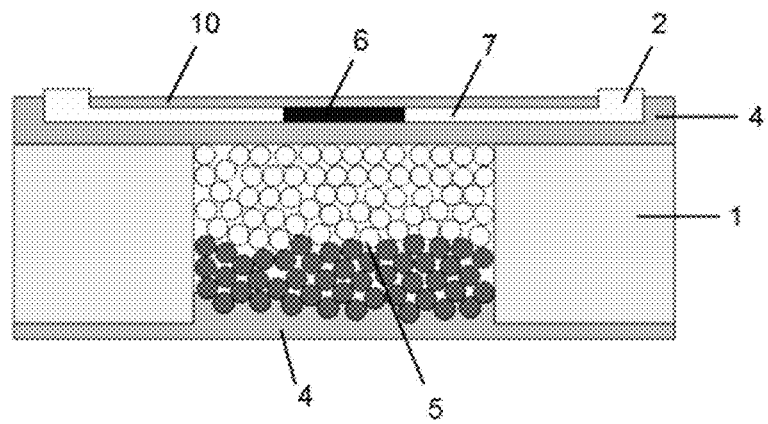

In contrast to FIG. 1a, FIG. 1b illustrates the case where the particles below the membrane are not completely solidified.

In the version shown in FIG. 2a, the thermally insulating areas in front of the sensor-specific structures are generated, i.e. integrated into the manufacturing process of the sensor. The substrate with the embedded porous areas is optionally planarized before further processing, e.g. by grinding and polishing. At least some of the solidified particles are removed. A covering layer is then applied to seal the porous areas. Only then are the sensor-specific structures processed. In FIG. 2b the particles (analogous to FIG. 1b) are not completely solidified. Moreover, the unsolidified particles can be etched out by the porous structure of the solidified area prior to application of the sealing layer.

The thermal insulation of a hotplate by means of a porous body according to FIG. 1 or FIG. 2 offers decisive advantages compared to conventional MEMS components.

The advantages of this embodiment are the mechanical stiffening of the hotplate and the suppression of convection effects and pressure fluctuations in the cavity below the sensor membrane, which can falsify the measurement.

Figure 3A:
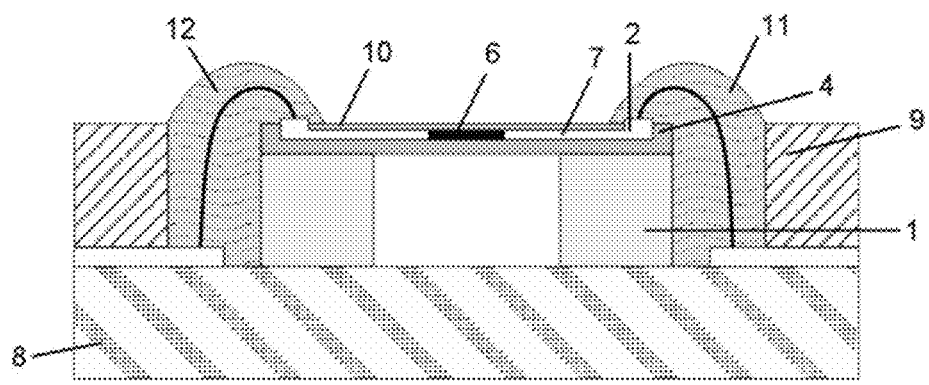
FIGS. 3a and 3b show schematic diagrams of the assembly and connection technique for a flux meter with conventional assembly (a) and inventional assembly (b). The latter is based on an embedded, porous body for thermal insulation and features vertical electrical feedthroughs (TSV).
Figure 3B:
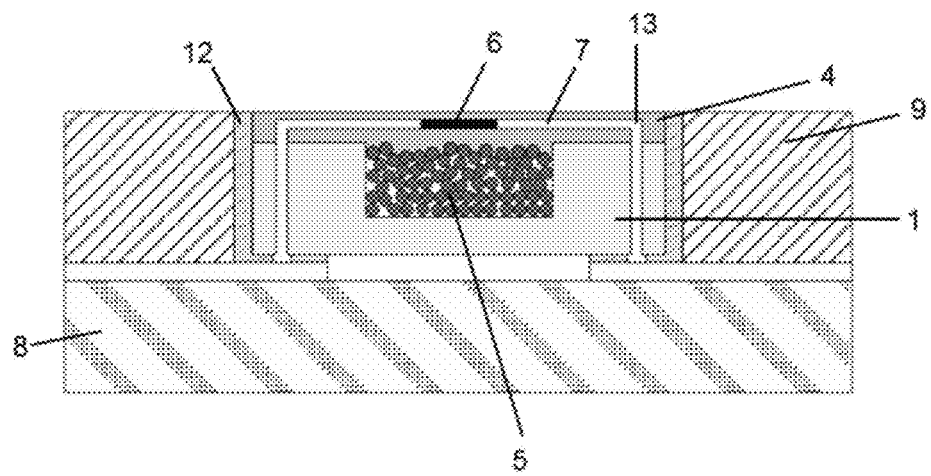

A further advantage is the processability of the silicon substrate with embedded porous structures like a normal wafer. Using established semiconductor technology techniques, vertical electrical feedthroughs (Through Silicon Vias, TSV) can easily be integrated to spatially separate the electrical connections from the sensor area. By relocating the electrical connections to the rear of the sensor chip, its assembly and connection technology is considerably simplified. With conventional components, the bonding wires must be cast with a suitable plastic (Glob-Top) according to FIG. 3a if the medium to be monitored is corrosive or contains moisture. Often a cover is mounted to protect the electrical supply lines on the carrier. In the case of a flow meter, the flow of the medium to be monitored is impaired by the encapsulated bonding wires. Components with TSV may require covering and sealing of the gaps, see FIG. 3b. The flow of the medium over the sensor surface is virtually unaffected.

Figure 4A:
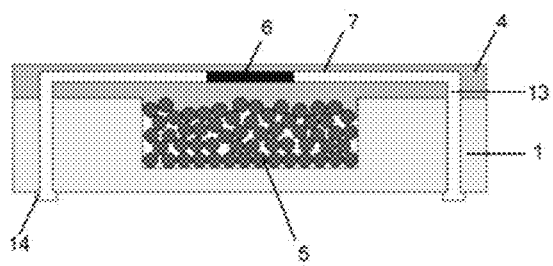
FIGS. 4a and 4b show schematic cross-sections through two possible inventive arrangements based on a thermal insulation of solidified particles where the electrical connections are spatially separated from the sensor area. Accordingly, the medium to be monitored is located in (a) on the top side and in (b) on the bottom side of the sensor chip.
Figure 4B:
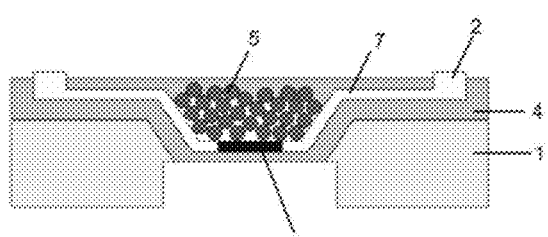
Figure 5:
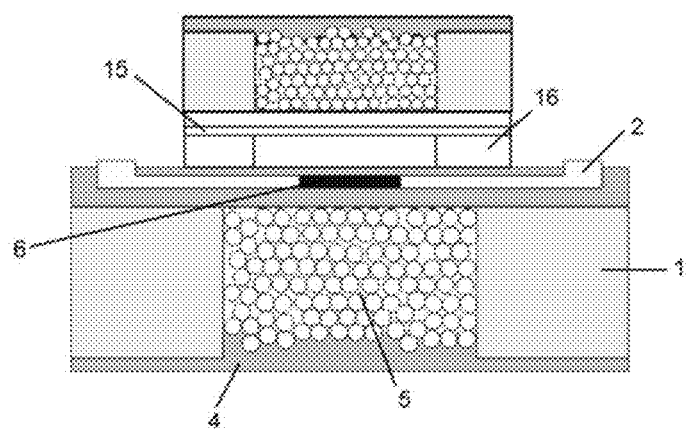
FIG. 5 shows an example of a embodiment in which an insulated reflector made of a thin layer of gold also helps to reduce losses due to radiation. To further reduce heat dissipation, this reflector is also thermally insulated and insulated by an evacuated cavity on its back, which is also filled with particles. This version is especially interesting for hotplates with high temperatures>500° C.
Figure 6A:
FIGS. 6a to 6e illustrate a process for producing a microsystem according to the invention.
Figure 6B:
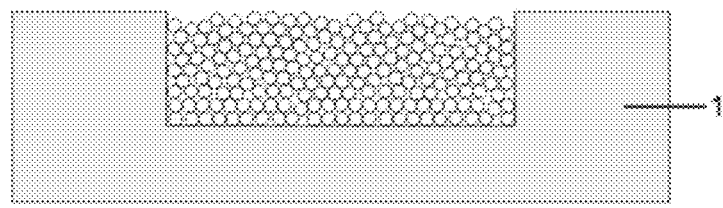
Figure 6C:
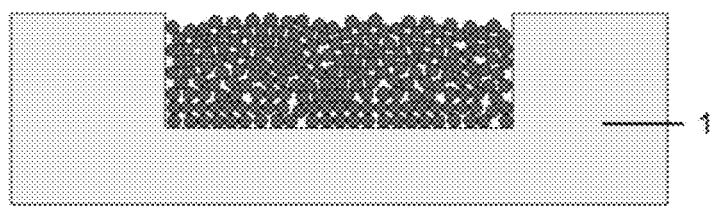
Figure 6D:
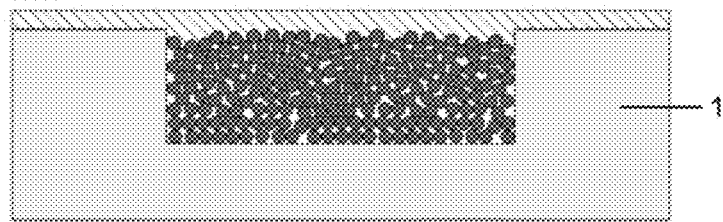
Figure 6E:
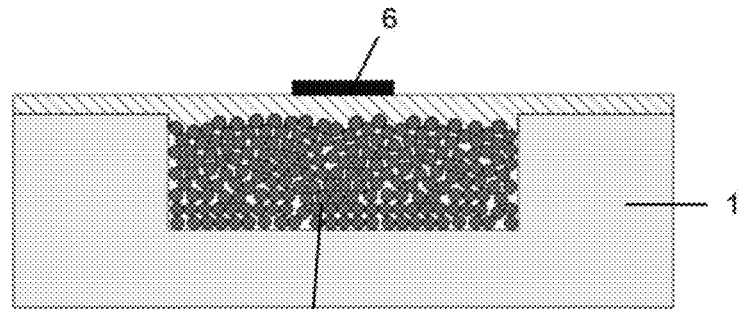
Figure 7A:
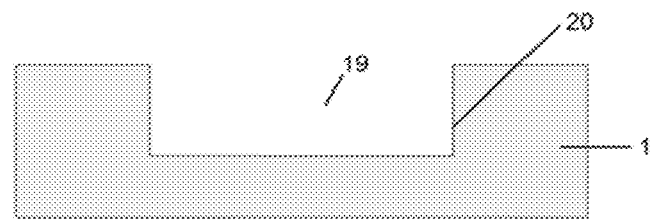
FIGS. 7a to 7e illustrate a process for producing a microsystem according to the invention.
Figure 7B:
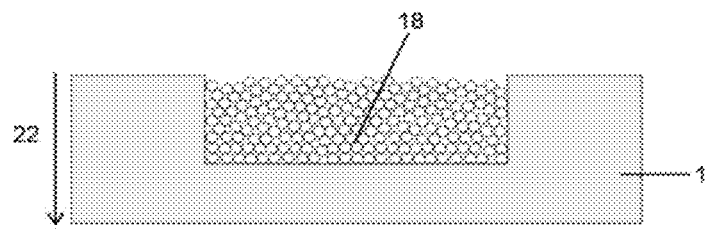
Figure 7C:
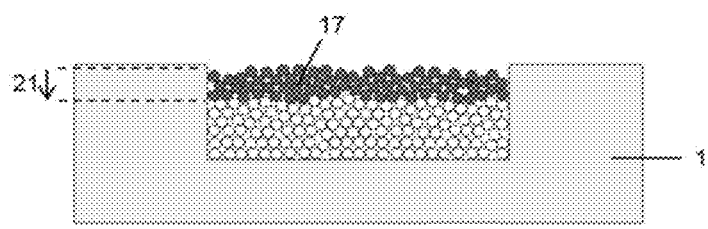
Figure 7D:
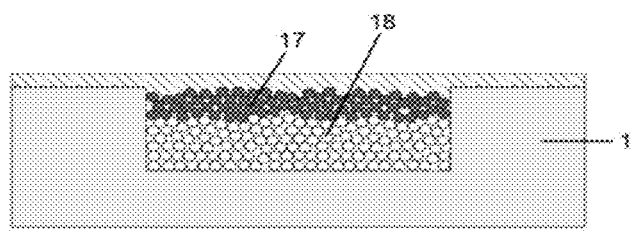
Figure 7E:
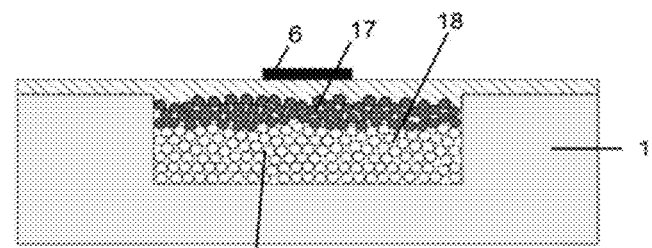
Figure 8A:
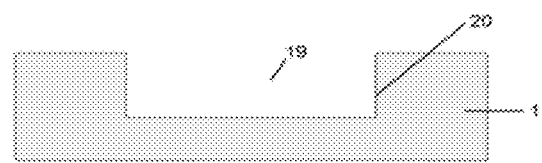
FIGS. 8a to 8f illustrate a process for producing a microsystem according to the invention.
Figure 8B:
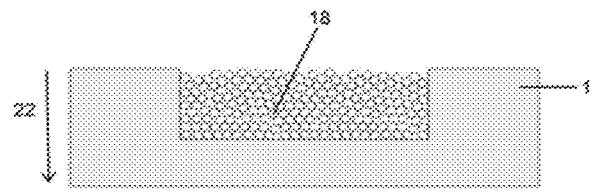
Figure 8C:
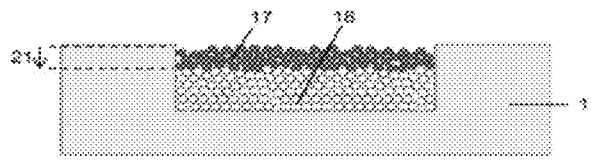
Figure 8D:
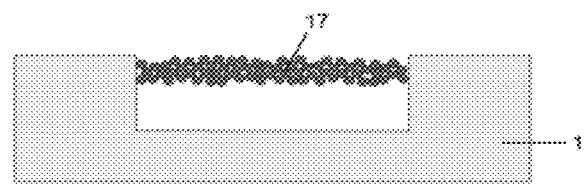
Figure 8E:
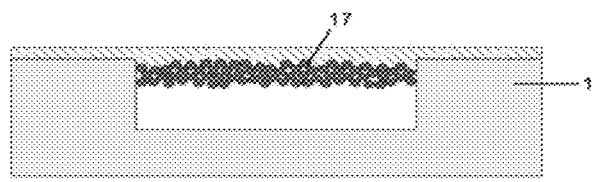
Figure 8F:
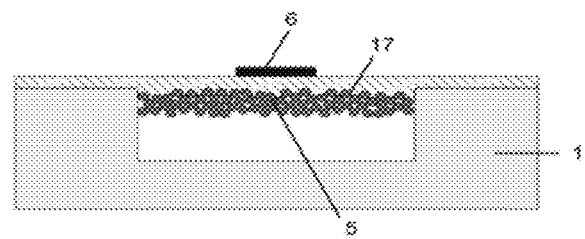

FIG. 4 shows two possible embodiments of a component with a thermally insulating porous area below the hotplate and a spatial separation of the electrical connections from the sensor area. The latter can also be achieved without TSV, see FIG. 4b. The hotplate is produced on the bottom of a KOH-etched cavity with inclined side surfaces. The electrical connections to the heater are made via the inclined side surfaces of the cavity to the surface. The cavity is then filled with particles. After applying a sealing layer, the surface can optionally be planarized. Finally, the silicon of the substrate is removed from the back to release the heater/temperature sensor. This can be done by full-surface ablation (grinding and polishing) and subsequent etching with a mask. Back-thinning of the substrate by grinding and polishing from the reverse side is also possible with the version according to FIG. 4a. These new insulation elements combine the possibilities of conventional super-insulations with microtechnical manufacturing processes. The loose particles inside the insulation ensure minimal contact surfaces between the individual particles, which in turn greatly reduces their contribution to thermal conductivity. Since there is also a vacuum within the insulation, there is no convection and there is no heat conduction via the molecular movement of gases.

LIST OF REFERENCE NUMERALS

1 Substrate
2 Bond pad
3 ALD layer (envelope)
4 Sealing layer
5 Heat insulation body
6 Heater
7 Electric supply line
8 Carrier
9 Cover
10 Diaphragm
11 Bonding wire
12 Glob-Top
13 Electrical feedthroughs (Through Silicon Vias, TSV)
14 Pad
15 Gold reflector
16 Assembly surfaces
17 First portion of the particles
18 Second portion of the particles
19 Opening
20 Recess
21 Penetration depth
22 Depth direction

The invention claimed is:

1. A microsystem comprising:
   a substrate, the substrate defining a recess, the recess having an opening;
   a heating element disposed above the substrate;
   a porous thermal insulating body disposed in the recess and composed of particles having a size in a range of from 1 μm to 100 μm and a thermal conductivity of less than 10 W/(m·K), wherein spaces between the particles provide porosity in the porous thermal insulating body, and at least a portion of the particles is bonded together by a coating having a thickness in a range of from 50 nm to 300 nm; and
   a sealing layer disposed on the porous thermal insulating body and configured to seal the opening of the recess;
   wherein said thermal insulating body has a porosity of 1 to 70% and is subjected to negative pressure.

2. The microsystem according to claim 1, wherein the particles have a thermal conductivity of less than 3 W/(m·K).

3. The microsystem according to claim 1, wherein all the particles are bonded together by the coating.

4. The microsystem according to claim 1, wherein the porous thermal insulating body is enclosed by an all-round wall so that uncoated particles are immovably enclosed in an all-round enclosure.

5. The microsystem according to claim 4, wherein the all-round enclosure is obtainable by filling the particles through the opening into the recess of the substrate of the microsystem and closing the opening after application of the coating by applying the sealing layer and/or by forming a solid coating by means of the coating of the particles at least at the opening.

6. The microsystem according to claim 1, wherein the thermal insulation body is arranged between at least two elements which have different temperatures during operation of the microsystem and/or between the heating element and the environment.

7. The microsystem according to claim 1, wherein the microsystem is a flow sensor, a gas sensor, a bolometer or an infrared light source.

8. The microsystem of claim 1, wherein the substrate is made of a material selected from the group consisting of silicon, glass and ceramic.

9. The microsystem of claim 1, wherein the particles are made of a material selected from the group consisting of silicon oxide, metal oxide, glass, and polymer.

10. The microsystem of claim 1, wherein the portion of the particles bonded together by the coating is in a range from 3% to 50%.

11. The microsystem of claim 1, wherein the coating is made of $Al_2O_3$.

12. The microsystem of claim 1, wherein the portion of the particles bonded together by the coating are solidified particles disposed at a bottom portion of the recess.

13. The microsystem of claim 1, wherein the portion of the particles bonded together by the coating are solidified particles disposed at an upper portion of the recess.

14. The microsystem of claim 1, wherein the portion of the particles bonded together by the coating are solidified particles disposed at an upper portion of the recess, and a bottom portion of the recess defines a void.

\* \* \* \* \*